United States Patent
Chen et al.

(10) Patent No.: US 9,190,279 B2
(45) Date of Patent: Nov. 17, 2015

(54) SEMICONDUCTOR DEVICE AND METHODS FOR FORMING THE SAME

(71) Applicant: Vanguard International Semiconductor Corporation, Hsinchu (TW)

(72) Inventors: Sue-Yi Chen, Hsinchu (TW); Chien-Hsien Song, Kaohsiung (TW); Chih-Jen Huang, Yilan County (TW)

(73) Assignee: Vanguard International Semiconductor Corporation, Hsinchu (TW)

( * ) Notice: Subject to any disclaimer, the term of this patent is extended or adjusted under 35 U.S.C. 154(b) by 24 days.

(21) Appl. No.: 13/870,451

(22) Filed: Apr. 25, 2013

(65) Prior Publication Data

US 2014/0319622 A1    Oct. 30, 2014

(51) Int. Cl.
| | |
|---|---|
| H01L 29/78 | (2006.01) |
| H01L 21/336 | (2006.01) |
| H01L 21/28 | (2006.01) |
| H01L 29/06 | (2006.01) |
| H01L 29/423 | (2006.01) |
| H01L 29/08 | (2006.01) |
| H01L 29/66 | (2006.01) |

(52) U.S. Cl.
CPC ...... *H01L 21/28008* (2013.01); *H01L 29/0649* (2013.01); *H01L 29/0878* (2013.01); *H01L 29/42356* (2013.01); *H01L 29/7816* (2013.01); *H01L 29/66659* (2013.01); *H01L 29/66689* (2013.01)

(58) Field of Classification Search
CPC ............ H01L 29/0878; H01L 29/0649; H01L 29/7816; H01L 29/66659; H01L 29/66689; H01L 29/42356; H01L 21/28008

USPC .......... 257/335, 337, 339, 343, 401, E29.063, 257/E29.133, E29.256, E21.417, E21.427; 438/195, 281, 282, 286
See application file for complete search history.

(56) References Cited

U.S. PATENT DOCUMENTS

| | | | | |
|---|---|---|---|---|
| 6,288,424 | B1 * | 9/2001 | Ludikhuize | 257/335 |
| 6,486,034 | B1 * | 11/2002 | Huang et al. | 438/281 |
| 8,822,291 | B2 * | 9/2014 | Zhang et al. | 438/286 |
| 2010/0173463 | A1 * | 7/2010 | Kim | 438/286 |
| 2012/0091527 | A1 * | 4/2012 | You | 257/343 |
| 2012/0228704 | A1 * | 9/2012 | Ju | 257/339 |
| 2012/0228705 | A1 * | 9/2012 | Toh et al. | 257/339 |
| 2013/0140632 | A1 * | 6/2013 | Landgraf et al. | 257/335 |
| 2013/0181285 | A1 * | 7/2013 | Ng et al. | 257/335 |
| 2014/0239371 | A1 * | 8/2014 | Tan et al. | 257/324 |
| 2014/0239391 | A1 * | 8/2014 | Toh et al. | 257/339 |

FOREIGN PATENT DOCUMENTS

TW            201234590 A      8/2012

* cited by examiner

*Primary Examiner* — Dao H Nguyen
(74) *Attorney, Agent, or Firm* — Birch, Stewart, Kolasch & Birch, LLP (57) ABSTRACT

A semiconductor device is disclosed. An isolation structure is formed in a substrate to define an active region of the substrate, wherein the active region has a field plate region. A gate dielectric layer is formed on the substrate outside of the field plate region. A step gate dielectric structure is formed on the substrate corresponding to the field plate region, wherein the step gate dielectric structure has a thickness greater than that of the gate dielectric layer and less than that of the isolation structure. A method for forming a semiconductor device is also disclosed.

16 Claims, 6 Drawing Sheets

SEMICONDUCTOR DEVICE AND METHODS FOR FORMING THE SAME

BACKGROUND OF THE INVENTION

1. Field of the Invention

The present invention relates to semiconductor technology, and in particular to methods for forming a high voltage (HV) semiconductor device having shallow trench isolation (STI).

2. Description of the Related Art

Power management integrated circuit (PMIC) is presently primarily applied to Bipolar-CMOS-LDMOS (BCD) structures. Complementary metal oxide semiconductor (CMOS) transistors may be used in digital circuits, bipolar transistors may be used for driving high current, and lateral diffused metal oxide semiconductor (LDMOS) transistors have high voltage handling capacity. The trends of power saving and high speed performance affect the LDMOS structure. LDMOSs with lower leakage and on-resistance (RDSon) have been developed by semiconductor manufacturers. RDSon is an important factor which affects the power consumption of the conventional LDMOS device.

Breakdown voltage is taken into account when the low on-resistance device is developed. The LDMOS devices are developed in various structures or by increasing the device size thereof to withstand the high breakdown voltage. However, since the device size is increased, the on-resistance is increased as well.

Accordingly, there exists a need in the art for development of a novel method for forming a semiconductor device that is capable of mitigating or eliminating the aforementioned problems.

BRIEF SUMMARY OF INVENTION

An exemplary embodiment of a semiconductor device according to the invention is provided. The semiconductor device comprises a substrate, an isolation structure, a gate dielectric layer and a step gate dielectric structure. The isolation structure is formed in the substrate to define an active region of the substrate, wherein the active region has a field plate region. The gate dielectric layer is formed on the substrate outside of the field plate region. The step gate dielectric structure is formed on the substrate corresponding to the field plate region, wherein the step gate dielectric structure has a thickness greater than that of the gate dielectric layer and less than that of the isolation structure.

An exemplary embodiment of a method for forming a semiconductor device according to the invention is provided. The method for forming a semiconductor device comprises providing a substrate having an isolation structure therein to define an active region of the substrate. A field plate region is defined in the active region. A gate dielectric layer is formed on the substrate outside of the field plate region and a step gate dielectric structure is formed on the substrate corresponding to the field plate region, wherein the step gate dielectric structure has a thickness greater than that of the gate dielectric layer and less than that of the isolation structure.

A detailed description is given in the following embodiments with reference to the accompanying drawings.

BRIEF DESCRIPTION OF DRAWINGS

The invention can be more fully understood by reading the subsequent detailed description and examples with references made to the accompanying drawings, wherein:

FIGS. 1 to 4A are cross-sectional views of an exemplary embodiment of a method for forming a semiconductor device according to the invention;

FIGS. 5 to 9A are cross-sectional views of yet another exemplary embodiment of a method for forming a semiconductor device according to the invention.

DETAILED DESCRIPTION OF INVENTION

The following description is of the best-contemplated mode of carrying out the invention. This description is provided for the purpose of illustrating the general principles of the invention and should not be taken in a limiting sense. The scope of the invention is best determined by reference to the appended claims. Moreover, the same or similar elements in the drawings and the description are labeled with the same reference numbers.

Figure 4A:
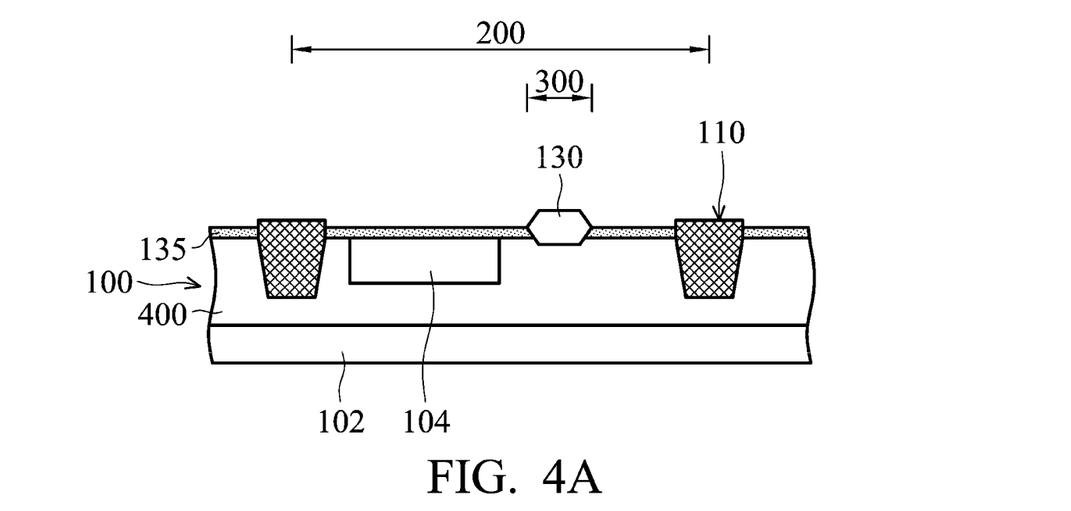

Referring to FIG. 4A, a cross-sectional view of an exemplary embodiment of a semiconductor device according to the invention is illustrated. In the embodiment, the semiconductor device may be implemented as a high voltage N-type MOS device, such as an N-type LDMOS, and comprises a substrate 100, an isolation structure 110, a gate dielectric layer 135 and a step gate dielectric structure 130. The substrate 100 has an active region 200 having a field plate region 300 therein. In the embodiment, the substrate 100 may comprise a semiconductor material layer, such as silicon layer (not shown), and an epitaxial layer 400 on the semiconductor substrate. In other embodiments, the substrate 100 may merely comprise the semiconductor substrate.

The isolation structure 110 is formed in the substrate 100 to define the active region 200 of the substrate 100. In the embodiment, the isolation structure 110 may be shallow trench isolation (STI).

The gate dielectric layer 135 is formed on the substrate 100 outside of the field plate region 300. In the embodiment, the gate dielectric layer 135 may comprise oxide or other suitable dielectric materials.

The step gate dielectric structure 130 is formed on the substrate 100 corresponding to the field plate region 300. In the embodiment, the step gate dielectric structure 130 has a thickness greater than that of the gate dielectric layer 135 and less than that of the isolation structure 110. In the embodiment, the step gate dielectric structure 130 further extends into the substrate 100, and the step gate dielectric structure 130 has a depth less than that of the isolation structure 110. In one embodiment, the step gate dielectric structure 130 may be local oxidation of silicon (LOCOS), such that the substrate 100 has the step gate dielectric structure 130 comprised of the LOCOS and the isolation structure 110 comprised of the STI.

In the embodiment, the substrate 100 may be an N-type substrate comprising an N-type drift region 104 in the active region 200 between the field plate region 300 and the isolation structure 110, and an N-type buried layer (NBL) 102 between the semiconductor material layer (not shown) and the N-type drift region 104.

In the conventional high voltage (such as greater than 20 V) device, a polysilicon gate extends to a field oxide or other isolation structure to prevent high electrical fields, but the breakdown voltage of the device is reduced. In the embodiment, the STI serving as the field oxide in the conventional high voltage device is replaced by a LOCOS formed in the field plate region, such that the substrate has a step gate dielectric structure comprised of the LOCOS and the isolation structure comprised of the STI. Compared to the STI serving as the field oxide in the conventional high voltage device, the depth of the step gate dielectric structure 130 extending into the substrate 100 is less than the depth of the isolation structure 110 since the step gate dielectric structure 130 has a thickness less than that of the isolation structure 110. As a result, the current path from drain to source is shortened. Accordingly, the on-resistance is reduced and the breakdown voltage maintains high.

Figure 4B:
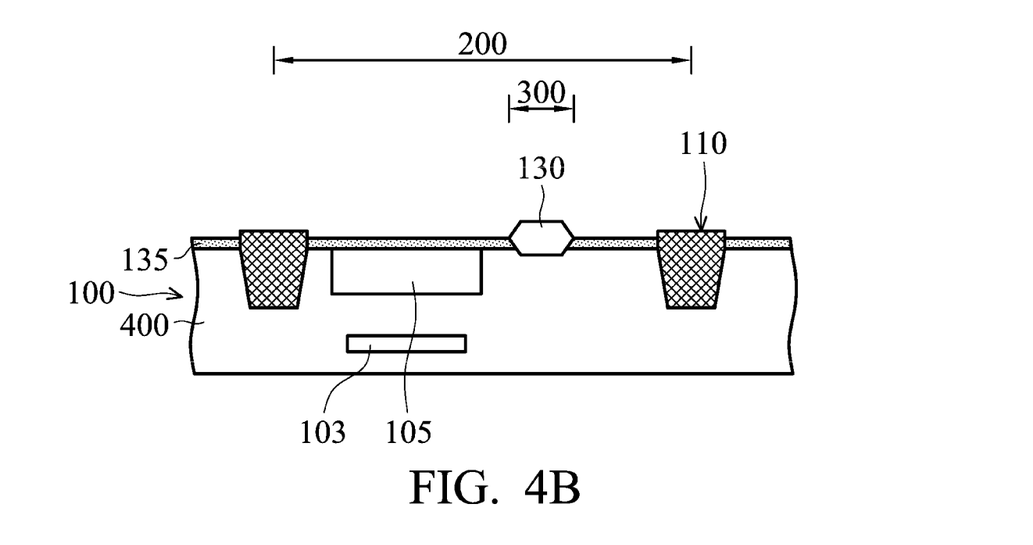
FIG. 4B is a cross-sectional view of another exemplary embodiment of a semiconductor device according to the invention.

Referring to FIG. 4B, a cross-sectional view of another exemplary embodiment of a semiconductor device according to the invention is illustrated, wherein elements in FIG. 4B that are the same as those in FIG. 4A are labeled with the same reference numbers as in FIG. 4A and are not described again for brevity. In the embodiment, the semiconductor device may be implemented as a high voltage P-type MOS device, such as P-type LDMOS, and similar to the above-mentioned embodiment in FIG. 4A. The difference between FIG. 4A and FIG. 4B is that the substrate 100 may be a P-type substrate comprising a P-type body region 105 in the active region 200 between the field plate region 300 and the isolation structure 110, and an N-type buried layer 103 under the P-type body region 105 in the active region 200.

Figure 9A:
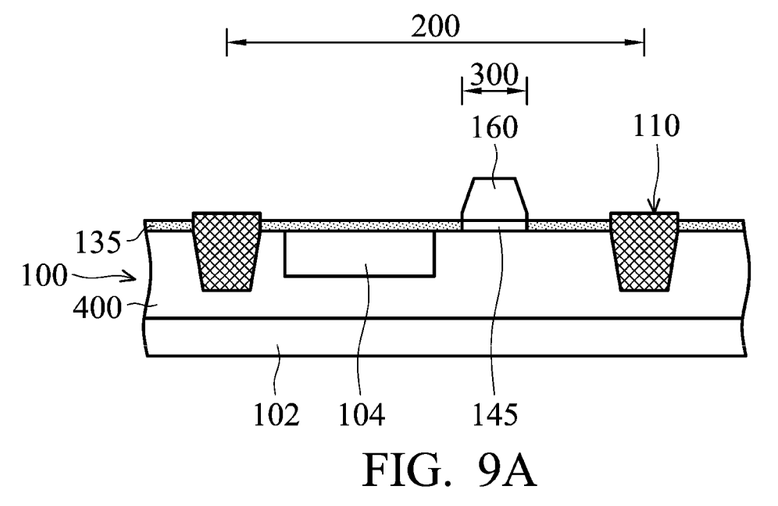

Referring to FIG. 9A, a cross-sectional view of yet another exemplary embodiment of a semiconductor device according to the invention is illustrated, wherein elements in FIG. 9A that are the same as those in FIG. 4A are labeled with the same reference numbers as in FIG. 4A and are not described again for brevity. In the embodiment, the semiconductor device may be implemented as a high voltage N-type LDMOS device and comprise a substrate 100, an isolation structure 110, a gate dielectric layer 135 and a step gate dielectric structure 160. The substrate 100 has an active region 200 having a field plate region 300 therein.

The isolation structure 110 is formed in the substrate 100 to define the active region 200 of the substrate 100. In the embodiment, the isolation structure 110 may be shallow trench isolation. The gate dielectric layer 135 is formed on the substrate 100 outside of the field plate region 300.

The step gate dielectric structure 160 is formed on the substrate 100 corresponding to the field plate region 300 and among the gate dielectric layer 135. In the embodiment, the step gate dielectric structure 160 has a thickness greater than that of the gate dielectric layer 135 and less than that of the isolation structure 110. In one embodiment, the step gate dielectric structure 130 may further comprise a thermal oxide layer 145 at its bottom.

In the embodiment, the substrate 100 may be an N-type substrate comprising an N-type drift region 104 in the active region 200 between the field plate region 300 and the isolation structure 110, and an N-type buried layer 102 under the isolation structure 110 and the active region 200.

In the embodiment, the STI serving as the field oxide in the conventional high voltage device is replaced by the step gate dielectric structure formed in the field plate region. Compared to the STI serving as the field oxide in the conventional high voltage device, the step gate dielectric structure 160 has a thickness less than that of the isolation structure 110, and the step gate dielectric structure 160 is formed on the substrate 100 without extending into the substrate 100. Accordingly, compared to the above-mentioned embodiments in FIGS. 4A and 4B, the current path from drain to source is further shortened, thereby further reducing the on-resistance.

Figure 9B:
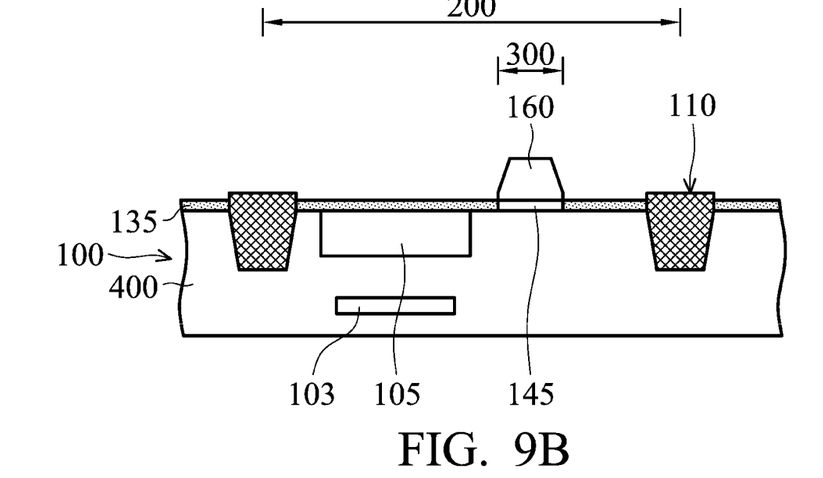
FIG. 9B is a cross-sectional view of yet another exemplary embodiment of a semiconductor device according to the invention.

Referring to FIG. 9B, a cross-sectional view of yet another exemplary embodiment of a semiconductor device according to the invention is illustrated, wherein elements in FIG. 9B that are the same as those in FIG. 9A are labeled with the same reference numbers as in FIG. 9A and are omitted for brevity. In the embodiment, the semiconductor device may be implemented as a high voltage P-type LDMOS device and similar to the above-mentioned embodiment in FIG. 9A. The difference between FIG. 9A and FIG. 9B is that the substrate 100 may be a P-type substrate comprising a P-type body region 105 in the active region 200 between the field plate region 300 and the isolation structure 110, and an N-type buried layer 103 under the P-type body region 105 in the active region 200.

Figure 1:
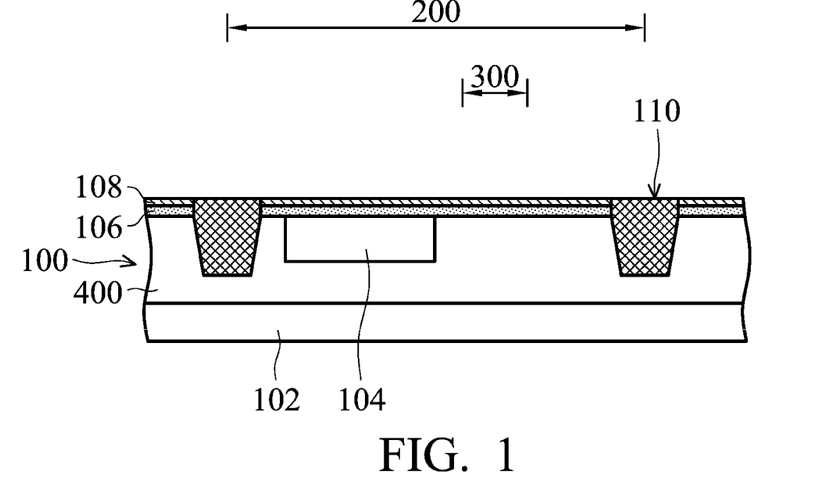

FIGS. 1 to 4A are cross-sectional views of an exemplary embodiment of a method for forming a semiconductor device according to the invention. Referring to FIG. 1, a substrate 100 is provided. The substrate 100 has an active region 200 having a field plate region 300 therein. In the embodiment, the substrate 100 may comprise a semiconductor substrate, such as silicon substrate (not shown), and an epitaxial layer 400 on the semiconductor substrate. In other embodiments, the substrate 100 may merely comprise the semiconductor substrate.

First, a hard mask, such as a pad oxide layer 106 and an overlying silicon nitride layer 108, is formed on the substrate 100. The hard mask may be patterned by conventional lithography and etching processes to define an isolation structure region and expose the substrate 100. The exposed substrate 100 is etched to form an isolation trench (not shown). Next, a liner may be formed on the sidewalls of the isolation trench. A high-density plasma oxide (not shown) is formed on the hard mask (i.e. the pad oxide layer 106 and the silicon nitride layer 108) and filled into the isolation trench by performing a high density plasma oxide chemical vapor deposition (HD-PCVD) process to form an isolation structure 110, such as STI, in the substrate 100, thereby defining the active region 200 of the substrate 100. The excess high density plasma oxide is then removed from the silicon nitride layer 108 by performing a chemical mechanical polishing (CMP) process to planarize the surface of the substrate 100.

In the embodiment, the substrate 100 may be an N-type substrate. An N-type drift region 104 is formed in the active region 200 between the field plate region 300 and the isolation structure 110. An N-type buried layer 102 is formed between the semiconductor material layer and the N-type drift region 104.

Figure 2:
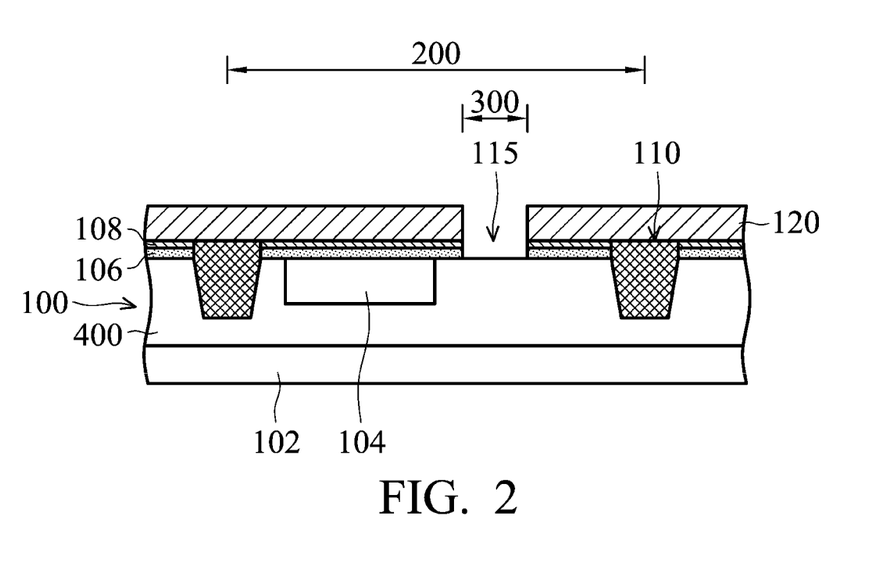

Referring to FIG. 2, a masking layer 120, such as photoresist, is formed on the substrate 100. The hard mask (i.e. the pad oxide layer 106 and the silicon nitride layer 108) on the substrate 100 is patterned by performing conventional lithography and etching processes to form an opening 115 in the hard mask corresponding to the field plate region 300 and expose a portion of the substrate 100.

Figure 3:
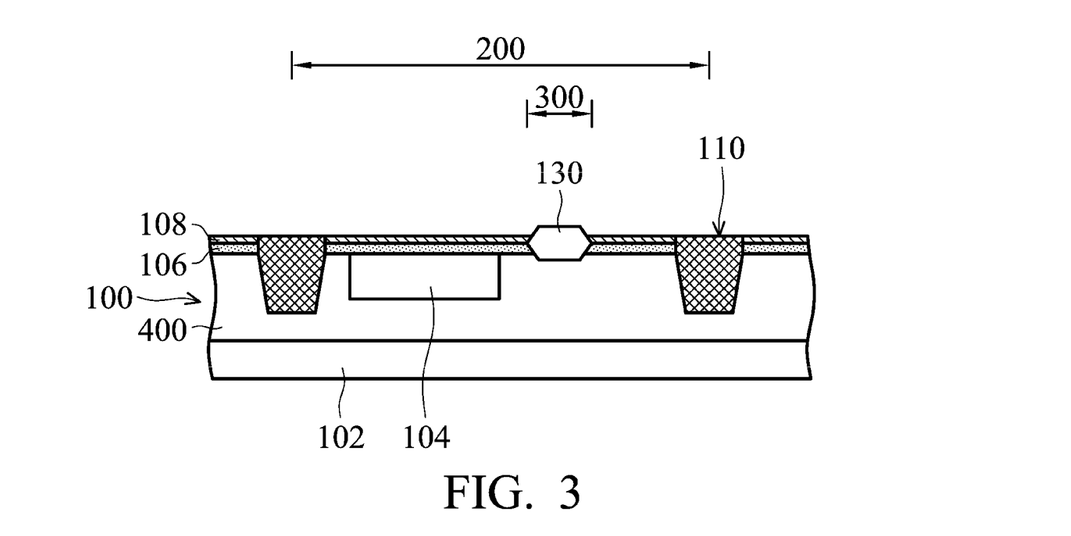

Referring to FIG. 3, after removing the masking layer 120, an insulating structure, such as LOCOS, is formed in the opening 115 by performing a wet oxide growth process and a densification process to serve as the step gate dielectric structure 130. In the embodiment, the step gate dielectric structure 130 further extends into the substrate 100, and the step gate dielectric structure 130 has a depth less than that of the isolation structure 110. In the embodiment, the substrate 100 has the step gate dielectric structure 130 comprised of the LOCOS and the isolation structure 110 comprised of the STI.

Referring to FIG. 4A, after forming the step gate dielectric structure 130, the hard mask (i.e. the pad oxide layer 106 and the silicon nitride layer 108) is removed by performing the etching process. In the above-mentioned steps, the step gate dielectric structure 130 may serve as an etch mask without forming an additional etch mask, to remove the pad oxide layer 106 and the silicon nitride layer 108. Next, the gate dielectric layer 135 is formed on the substrate 100 outside of the field plate region 300 to proceed to the subsequent semiconductor processing steps. In the embodiment, the gate dielectric layer 135 may comprise oxide or other suitable dielectric materials. In the embodiment, the step gate dielectric structure 130 has a thickness greater than that of the gate dielectric layer 135 and less than that of the isolation structure 110.

In another embodiment, as shown in FIG. 4B, the substrate 100 may be a P-type substrate. A P-type body region 105 is formed in the active region 200 between the field plate region 300 and the isolation structure 110. The N-type drift region 104 in FIG. 4A is replaced by the P-type body region 105. An N-type buried layer 103 is formed under the P-type body region 105 in the active region 200. The N-type buried layer 102 in FIG. 4A is replaced by the N-type buried layer 103.

In conventional semiconductor processes, after simultaneously forming the field oxide and the isolation structure in the substrate and performing the chemical mechanical polishing process, a hard mask, such as a pad oxide layer and a silicon nitride layer, on the substrate is directly removed and the subsequent processing steps are then proceeded to. According to an embodiment of the invention, after performing the chemical mechanical polishing process and before removing the hard mask, a masking layer having an opening corresponding to the field plate region is additionally formed. A LOCOS is formed in the field plate region by performing the etching process and the wet oxide growth to replace the STI serving as the field oxide in the conventional high voltage device, such that the semiconductor substrate has the step gate dielectric structure comprised of the LOCOS and the isolation structure comprised of the STI. Compared to the STI serving as the field oxide in the conventional high voltage device, since the step gate dielectric structure 130 has a thickness less than that of the isolation structure 110 and the depth of the step gate dielectric structure 130 extending into the substrate 100 is less than the depth of the isolation structure 110, the current path from drain to source is shortened. Accordingly, the on-resistance is reduced and the breakdown voltage remains high, thereby reducing the power consumption of the lateral metal oxide semiconductor field effect transistor device.

Figure 5:
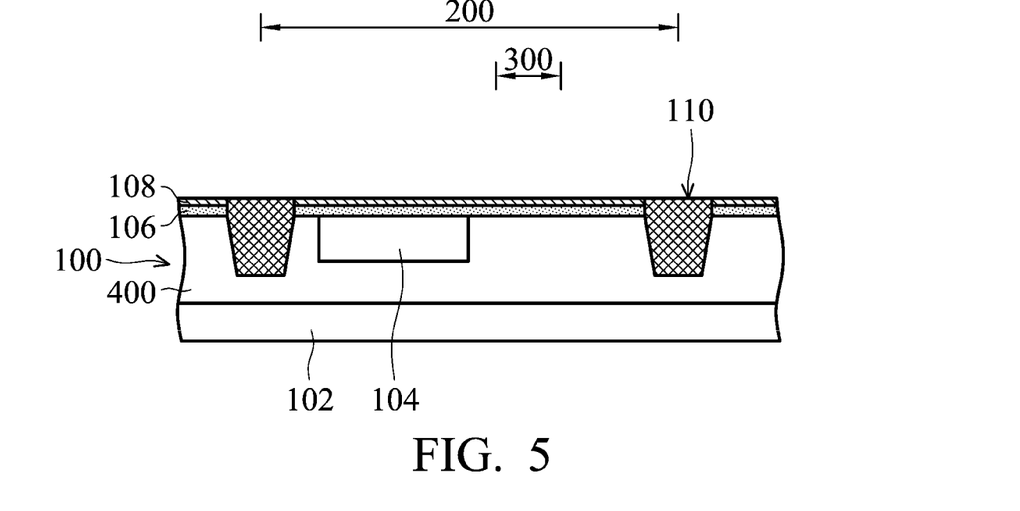

FIGS. 5 to 9A are cross-sectional views of another exemplary embodiment of a method for forming a semiconductor device according to the invention, wherein elements in FIGS. 5 to 9A that are the same as those in FIGS. 1 to 4A are labeled with the same reference numbers as in FIGS. 1 to 4A and are not described again for brevity. Referring to FIG. 5, a substrate 100 is provided. The substrate 100 has an active region 200 having a field plate region 300 therein.

First, a hard mask, such as a pad oxide layer 106 and overlying silicon nitride layer 108, is formed on the substrate 100. The hard mask may be patterned by conventional lithography and etching processes to define the isolation structure region and expose the substrate 100. The exposed substrate 100 is etched to form an isolation trench (not shown). Next, a liner (not shown) may be formed on the sidewalls of the isolation trench. A high density plasma oxide (not shown) is formed on the hard mask (i.e. the pad oxide layer 106 and the silicon nitride layer 108) and filled into the isolation trench by performing a high density plasma oxide chemical vapor deposition process to form an isolation structure 110, such as STI, in the substrate 100 and define the active region 200 of the substrate 100. The excess high density plasma oxide on the silicon nitride layer 108 is then removed by performing a chemical mechanical polishing process to planarize the surface of the substrate 100.

In the embodiment, the substrate 100 may be an N-type substrate. An N-type drift region 104 is formed in the active region 200 between the field plate region 300 and the isolation structure 110. An N-type buried layer 102 is formed between the semiconductor material layer and the N-type drift region 104.

Figure 6:
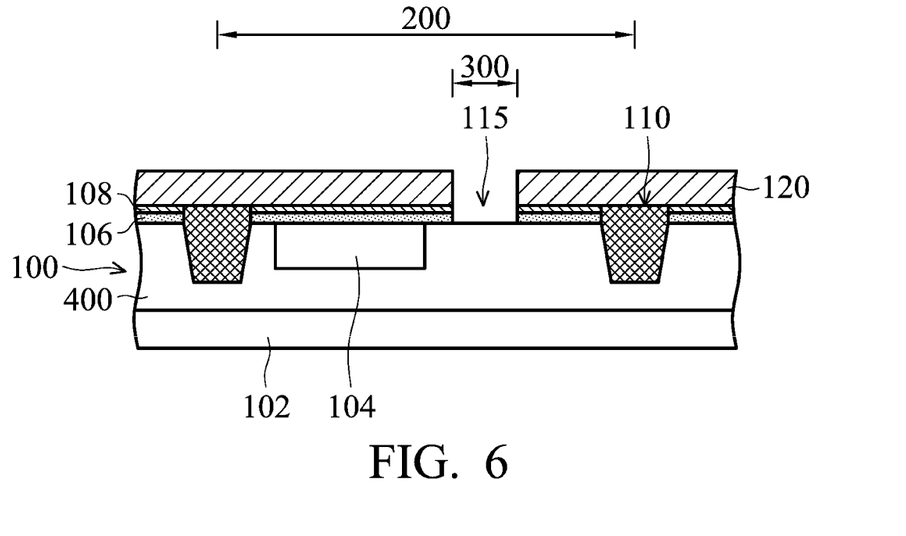

Referring to FIG. 6, a masking layer 120 is formed on the substrate 100. The hard mask (i.e. the pad oxide layer 106 and the silicon nitride layer 108) on the substrate 100 is patterned by performing a conventional lithography and etching processes to form an opening 115 on the hard mask corresponding to the field plate region 300 and expose portions of the substrate 100.

Figure 7:
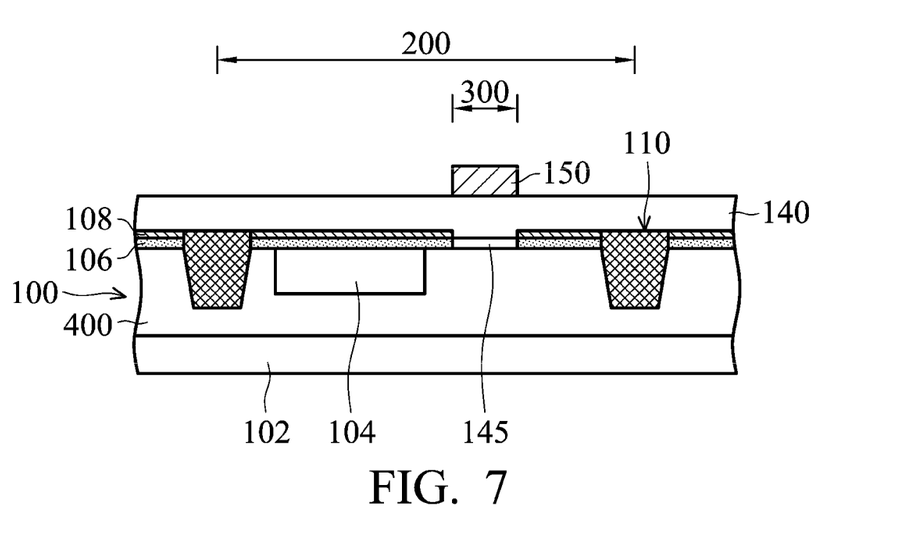
Figure 8:
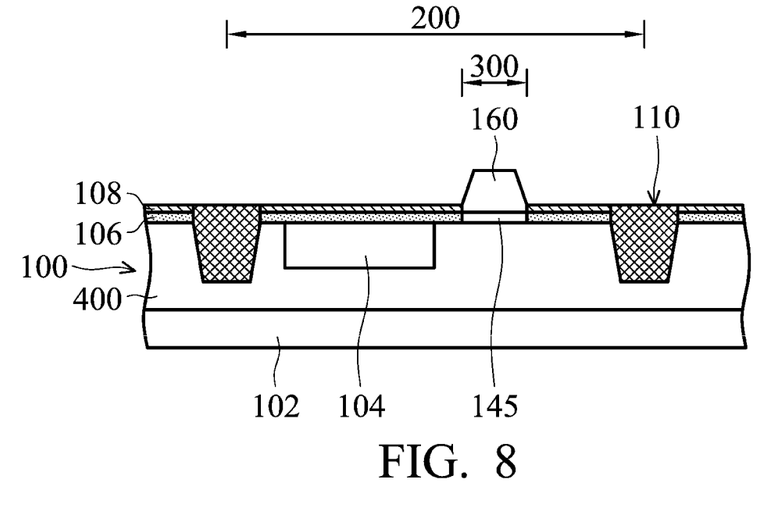

Referring to FIG. 7, after removing the masking layer 120, a blanket oxide layer 140 may be formed on the hard mask and filled into the opening 115 in the hard mask by performing a high temperature oxide (HTO) deposition process and a densification process. In the embodiment, a thermal oxide layer 145 may be formed in the bottom of the opening 115 by performing a thermal oxide process before forming the oxide layer 140 to improve the adhesion between the substrate 100 and the oxide layer 140, thereby releasing some charges and preventing the oxide layer 140 from peeling off the substrate 100. Next, a masking layer 150 is formed on the oxide layer 140 by performing a conventional lithography process. The oxide layer 140 is patterned by performing a conventional etching process to form an insulating structure serving as the step gate dielectric structure 160 in and above the opening 115, and expose the isolation structure 110 and the hard mask, as shown in FIG. 8. In the above-mentioned steps, the hard mask may serve as an etch stop layer to prevent the underlying material layers from being damaged by over-etching and avoid reducing the isolation effect of the isolation structure 110.

Referring to FIG. 9A, after forming the step gate dielectric structure 160, the hard mask (i.e. the pad oxide layer 106 and the silicon nitride layer 108) is removed by performing a conventional etching process. In the above-mentioned steps, the step gate dielectric structure 160 may serve as an etch mask without forming an additional etch mask, to remove the pad oxide layer 106 and the silicon nitride layer 108. Next, a gate dielectric layer 135 is formed on the substrate 100 outside of the field plate region 300 to proceed to the subsequent semiconductor processing steps. In the embodiment, the step gate dielectric structure 160 has a thickness greater than that of the gate dielectric layer 135 and less than that of the isolation structure 110.

In another embodiment, as shown in FIG. 9B, the substrate 100 may be a P-type substrate. A P-type body region 105 is formed in the active region 200 between the field plate region 300 and the isolation structure 110. The N-type drift region 104 in FIG. 9A is replaced by the P-type body region 105. An N-type buried layer 103 is formed under the P-type body region 105 in the active region 200. The N-type buried layer 102 in FIG. 9A is replaced by the N-type buried layer 103.

According to another embodiment of the invention, after performing a chemical mechanical polishing process and before removing the hard mask, a masking layer having an opening corresponding to the field plate region and another masking layer used for defining the step gate dielectric structure are additionally formed. The step gate dielectric structure is formed in the field plate region by two etching processes and a high temperature oxide deposition process between the two etching processes. The STI serving as the field oxide in the conventional high voltage device is replaced by the step gate dielectric structure. Compared to the STI serving as the field oxide as in the conventional high voltage device, the step gate dielectric structure 160 has a thickness less than that of the isolation structure 110 and the step gate dielectric structure 160 does not extend into the substrate 100. Accordingly, compared to the above-mentioned embodiments in FIGS. 1 to 4A and 4B, the current path from drain to source is further shortened to reduce further the on-resistance and maintain the high breakdown voltage, thereby reducing the power consumption of the lateral metal oxide semiconductor field effect transistor device.

While the invention has been described by way of example and in terms of preferred embodiment, it is to be understood that the invention is not limited thereto. On the contrary, it is intended to cover various modifications and similar arrangements (as would be apparent to those skilled in the art). Therefore, the scope of the appended claims should be accorded the broadest interpretation so as to encompass all such modifications and similar arrangements.

What is claimed is:

1. A semiconductor device, comprising:
   a substrate;
   an isolation structure formed in the substrate to define an active region of the substrate, wherein the active region has a field plate region;
   a gate dielectric layer formed on the substrate outside of the field plate region; and
   a step gate dielectric structure formed on the substrate corresponding to the field plate region without extending into the substrate,
   wherein the step gate dielectric structure has a thickness greater than that of the gate dielectric layer and less than that of the isolation structure,
   wherein the step gate dielectric structure comprises a thermal oxide layer at its bottom, and
   wherein the isolation structure comprises an insulating material and has a top surface located between the thermal oxide layer and a top surface of the step gate dielectric structure.

2. The semiconductor device as claimed in claim 1, wherein the isolation structure is a shallow trench isolation.

3. The semiconductor device as claimed in claim 2, wherein the top surface of the isolation structure is located above the gate dielectric layer.

4. The semiconductor device as claimed in claim 1, wherein the substrate further comprises a P-type body region in the active region between the field plate region and the isolation structure.

5. The semiconductor device as claimed in claim 1, wherein the substrate further comprises an N-type drift region in the active region between the field plate region and the isolation structure.

6. The semiconductor device as claimed in claim 1, wherein the thermal oxide layer has a thickness equal to that of the gate dielectric layer.

7. A method for forming a semiconductor device, comprising:
   providing a substrate having an isolation structure therein to define an active region of the substrate;
   defining a field plate region in the active region; and
   forming a gate dielectric layer on the substrate outside of the field plate region and forming a step gate dielectric structure on the substrate corresponding to the field plate region without extending into the substrate, wherein the step gate dielectric structure has a thickness greater than that of the gate dielectric layer and less than that of the isolation structure, wherein the step gate dielectric structure comprises a thermal oxide layer at its bottom, and wherein the isolation structure comprises an insulating material and has a top surface located between the thermal oxide layer and a top surface of the step gate dielectric structure.

8. The method as claimed in claim 7, wherein the isolation structure is a shallow trench isolation.

9. The method as claimed in claim 8, wherein the top surface of the isolation structure is located above the gate dielectric layer.

10. The method as claimed in claim 7, wherein the substrate further comprises a P-type body region in the active region between the field plate region and the isolation structure.

11. The method as claimed in claim 7, wherein the substrate further comprises an N-type drift region in the active region between the field plate region and the isolation structure.

12. The method as claimed in claim 7, wherein the step of forming the step gate dielectric structure comprises:
    patterning a hard mask on the substrate to form an opening in the hard mask corresponding to the field plate region and expose the substrate; and
    forming an insulating structure in the opening to serve as the step gate dielectric structure.

13. The method as claimed in claim 12, wherein a portion of the insulating structure is formed by performing a high temperature oxide process on the exposed substrate.

14. The method as claimed in claim 12, wherein the step of forming the insulating structure in the opening comprises:
    forming a blanket oxide layer on the hard mask and filled into the opening in the hard mask; and
    patterning the blanket oxide layer to form the insulating structure in and above the opening, and expose the isolation structure and the hard mask.

15. The method as claimed in claim 12, further comprising removing the hard mask after forming the step gate dielectric structure, wherein the gate dielectric layer is formed after removing the hard mask.

16. The method as claimed in claim 7, wherein the thermal oxide layer has a thickness equal to that of the gate dielectric layer.

* * * * *